(12) United States Patent
Kim

(10) Patent No.: US 6,542,012 B2
(45) Date of Patent: Apr. 1, 2003

(54) CIRCUIT FOR DRIVING GATE OF IGBT INVERTER

(75) Inventor: Min Keuk Kim, Seoul (KR)

(73) Assignee: LG Industrial Systems Co., Ltd., Seoul (KR)

( * ) Notice: Subject to any disclaimer, the term of this patent is extended or adjusted under 35 U.S.C. 154(b) by 0 days.

(21) Appl. No.: 09/987,472

(22) Filed: Nov. 14, 2001

(65) Prior Publication Data

US 2002/0057114 A1 May 16, 2002

(30) Foreign Application Priority Data

Nov. 14, 2000  (KR) ........................................ 2000-31795

(51) Int. Cl.[7] ........................ H03K 3/00; H03K 17/687; H03K 17/16
(52) U.S. Cl. ..................... 327/112; 327/432; 327/434; 327/310; 327/379; 327/389
(58) Field of Search ................................ 327/108, 111, 327/112, 110, 427, 430, 431–437, 379, 387, 389, 391, 310, 313, 478; 326/26, 27, 85, 87

(56) References Cited

U.S. PATENT DOCUMENTS

| 4,649,321 | A | * | 3/1987 | Ferraro ........................ 327/432 |
| 5,103,148 | A | * | 4/1992 | Berringer et al. ............ 318/432 |
| 5,121,283 | A | * | 6/1992 | Ibori et al. .................. 361/93.1 |
| 5,526,216 | A | * | 6/1996 | Konrad et al. ............... 327/310 |
| 6,054,890 | A | * | 4/2000 | Giacomo ..................... 327/434 |
| 6,057,728 | A | * | 5/2000 | Igarashi ....................... 327/427 |

* cited by examiner

*Primary Examiner*—Toan Tran
(74) *Attorney, Agent, or Firm*—Birch, Stewart Kolasch & Birch, LLP

(57) ABSTRACT

Disclosed is a circuit for driving a gate of an IGBT (insulated gate bipolar transistor) inverter. The present invention includes a first IGBT of which collector is connected to a DC voltage, a second IGBT of which collector is connected to an emitter of the first IGBT, wherein an output signal is outputted from a connection point between the collector of the second IGBT and the emitter of the first IGBT, and of which emitter is connected to a ground, first and second driving circuits supplying gates and the emitters of the first and second IGBTs with DC driving voltages, respectively, through first and second gate resistors, and first and second noise interruption circuits connected between the gates-emitters of the first and second IGBTs and the first and second driving circuits, respectively, so as to interrupt noises. Accordingly, the present invention enables to settle the problems such as selection of the driving circuits, selection of the fate driving resistors, and limitation of a gate driving distance. Moreover, the present invention enables to improve a reliability of the circuits.

1 Claim, 4 Drawing Sheets

US 6,542,012 B2

CIRCUIT FOR DRIVING GATE OF IGBT INVERTER

BACKGROUND OF THE INVENTION

1. Field of the Invention

The present invention relates to a circuit for driving a gate of an insulated gate bipolar transistor (hereinafter abbreviated IGBT) inverter, and more particularly, to a single power gate driving circuit in an IGBT inverter which enables to drive a gate at a long distance by removing a noise generated as a gate driving distance gets long.

2. Background of the Related Art

FIG. 1 illustrates an equivalent circuit of a general IGBT device. In a single power driving method, a positive voltage or a zero voltage is applied to an IGBT inverter. But, in a dual power driving method, a positive voltage or a zero voltage, or a negative voltage is applied to an IGBT device.

When a DC voltage is applied across gate and emitter in the single power driving method, collector and emitter are electrically connected each other. When a zero voltage is applied between gate and emitter, collector and emitter are electrically disconnected. In other words, the IGBT device carries out a switching operation in accordance with a gate-applied voltage. In this case, 'Cce', 'Ccg', and 'Cge' indicate equivalent capacitances existing minutely between the respective terminals (collector-emitter, collector-gate, and gate-emitter).

Generally, the dual power driving method is used for a DC power source for driving a gate of the IGBT inverter. Yet, the dual power driving method fails to simplify the relatively complicated circuit construction, reduce the size of the inverter, and decrease the species of the voltages to reduce a cost. Accordingly, the single power driving method using the positive or zero voltage is commercialized.

FIG. 2 illustrates a general switching device using IGBT.

Referring to FIG. 2, a switching device using IGBT includes a first IGBT 1 of which collector is connected to a DC voltage Vdc and a second IGBT 2 of which collector is connected to an emitter of the first IGBT 1 and of which emitter is connected to a ground GND. When DC driving signals 3 and 4 having polarities opposite to each other are applied to gates of the first or second IGBTs 1 and 2 respectively, an output signal Vout is outputted from a connection point between the first and second IGBTs 1 and 2. In this case, the circuit shown in FIG. 2 represents an inverter circuit in part.

The switching device using the above-constructed IGBTs carries out 'ON' and 'OFF' of the first and second IGBTs 1 and 2 by the DC driving signals applied to the gates of the first and second IGBTs 1 and 2 so as to output the output signal Vout having the DC voltage Vdc or a voltage of the ground GND.

The above operational control is explained in detail as follows.

First, when the first IGBT 1 turns 'ON' and the second IGBT 2 turns 'OFF' by the DC driving signals 3 and 4, the output signal Vout becomes the DC voltage Vdc.

On the other hand, when the first IGBT 1 turns 'OFF' and the second IGBT 2 turns 'ON' by the DC driving signals 3 and 4, the output signal Vout becomes the ground voltage GND, that is zero voltage. Thus, the first and second IGBTs 1 and 2 carries out the 'ON' and 'OFF' controls, thereby enabling to mainly carry out the function of an inverter.

In this case, the DC driving signals 3 and 4 should prevent the first and second IGBTs 1 and 2 from turning 'ON' simultaneously. If both of the IGBTs turned 'ON', the DC voltage Vdc and ground GND are shorted to allow a large flow of a current, thereby breaking down the IGBTs 1 and 2. Thus, the DC driving signals 3 and 4 should have polarities opposite to each other absolutely. Moreover, the voltage applied between the gate and emitter of the first and second IGBTs 1 and 2 should be higher than a threshold voltage so as to drive the inverter.

FIG. 3 illustrates an IGBT inverter according to a prior art.

Referring to FIG. 3, an IGBT inverter according to a prior art includes a first IGBT 11 of which collector is connected to a DC voltage Vdc, a second IGBT 12 of which collector is connected to an emitter of the first IGBT 11 and of which emitter is connected to a ground GND, a first driving circuit 13 connected between gate and emitter of the first IGBT 11 so as to supply the gate of the first IGBT 11 with a driving voltage Vge through a first resistor R1, and a second driving circuit 14 connected between gate and emitter of the second IGBT 12 so as to supply the gate of the second IGBT 12 with a driving voltage Vge through a second resistor R2. In this case, an output signal Vout is outputted from a connection point between the first and second IGBTs 11 and 12.

The above-constructed IGBT inverter according to a prior art, as explained in FIG. 2, controls 'ON' and 'OFF' of the first and second IGBTs 11 and 12 by applying the DC driving voltages between the gates and emitters of the first and second IGBTs through the first and second driving circuits 13 and 14, respectively.

In this case, it is able to control speeds of 'ON' and 'OFF' between the collectors and emitters of the first and second IGBTs 11 and 12 respectively by adjusting current values applied to the gates of the first and second IGBTs 11 and 12 by setting up values of the first and second resistors R1 and R2 respectively. When the first or second IGBT 11 or 12 turns 'ON', voltages between the collectors and emitters are determined in accordance with the levels of the DC voltages applied thereto through the first and second driving circuits 13 and 14.

In case that the first and second IGBTs 11 and 12 are 'ON' and 'OFF' respectively or 'OFF' and 'ON' respectively, operations of the IGBT inverter according to a prior art will be explained in detail by referring to FIG. 4 and FIG. 5 in the following description.

FIG. 4 illustrates an operation of the first IGBT 11 in FIG. 3.

Referring to FIG. 4, the first IGBT 11 turns 'ON' when the driving voltage is applied thereto at a time point of t1. In this case, when the DC voltage Vdc is applied between the collector and emitter of the second IGBT 12, an output current I1 flows toward an output voltage terminal and a current I2 charging the equivalent capacitance Cge between the gate and emitter through the equivalent capacitance Ccg between the collector and gate of the second IGBT 12 is generated, simultaneously. Thus, a noise is generated from a driving signal of the second IGBT 12 during a short time for which electric charges charged in the equivalent capacitance Cge between the gate and emitter are discharged to the ground GND.

FIG. 5 illustrates an operation of the second IGBT 12 in FIG. 3.

Referring to FIG. 5, the second IGBT 12 turns 'ON' when the driving voltage is applied thereto at a time point of t2. In this case, when the DC voltage Vdc is applied between the collector and emitter of the first IGBT 11, an output current I1 flows from the output voltage terminal to the ground GND. At the same time, a current I2 charging the equivalent capacitance Cge between the gate and emitter through the equivalent capacitance Ccg between the collector and gate of the first IGBT 11 is generated. Thus, a noise is generated from a driving signal of the first IGBT 11 during a short time for which electric charges charged in the equivalent capacitance Cge between the gate and emitter are discharged to the ground GND.

As mentioned in the above explanation, the IGBT inverter according to the prior art, when the noise generated from the driving signal of the first or second IGBT gate exceeds the threshold voltage, makes both of the first and second IGBTs turn 'ON' so as to short the DC voltages and the ground each other. Therefore, a large current flows therebetween so as to break down the IGBTs.

Unfortunately, the IGBT inverter according to the prior art has difficulty in minimizing a gate driving distance not to make the noise exceed the threshold voltage as well as selecting the gate driving resistors and the driving circuits.

SUMMARY OF THE INVENTION

Accordingly, the present invention is directed to a circuit for driving a gate of an IGBT inverter that substantially obviates one or more problems due to limitations and disadvantages of the prior art.

An object of the present invention is to provide a circuit for driving a gate of an IGBT inverter having no difficulty in selecting gate driving resistors and circuits as well as adjusting gate driving distances freely.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a circuit for driving a gate of an IGBT inverter according to the present invention includes a first IGBT of which collector is connected to a DC voltage source, a second IGBT of which collector is connected to an emitter of the first IGBT, wherein an output signal is outputted from a connection point between the collector of the second IGBT and the emitter of the first IGBT, and of which emitter is connected to a ground, first and second driving circuits supplying across gates and the emitters of the first and second IGBTs with DC driving voltages, respectively, through first and second gate resistors, and first and second noise interruption circuits connected between the gates-emitters of the first and second IGBTs and the first and second driving circuits, respectively, so as to interrupt noises.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
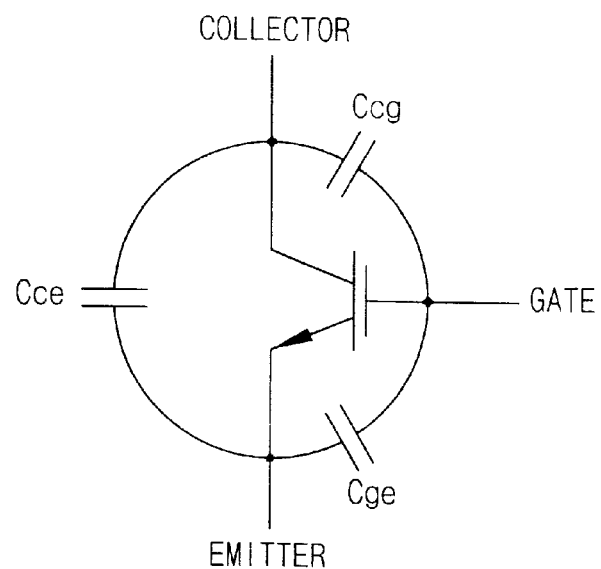
FIG. 1 illustrates an equivalent circuit of a general IGBT device.
Figure 2:
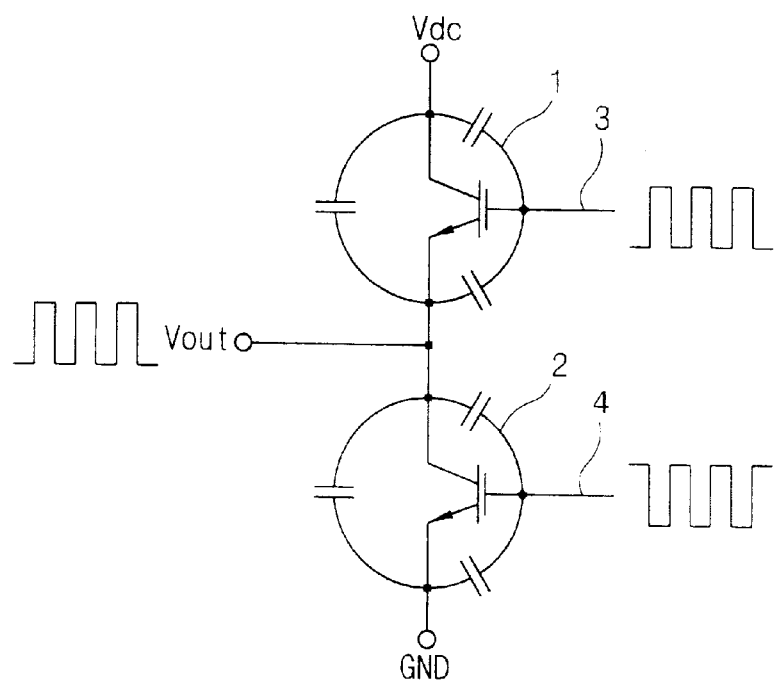
FIG. 2 illustrates a general switching device using IGBT.
Figure 3:
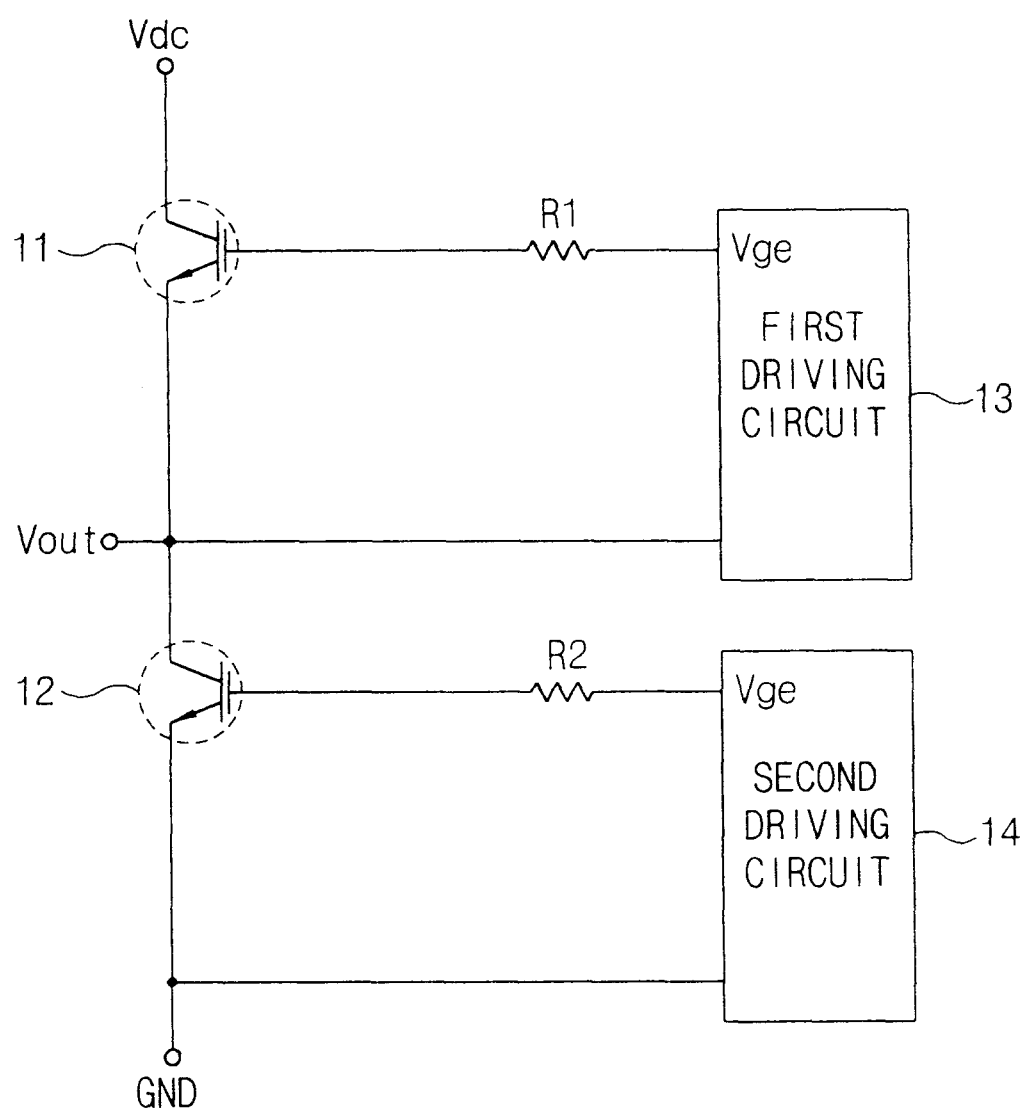
FIG. 3 illustrates an IGBT inverter according to a prior art.
Figure 4:
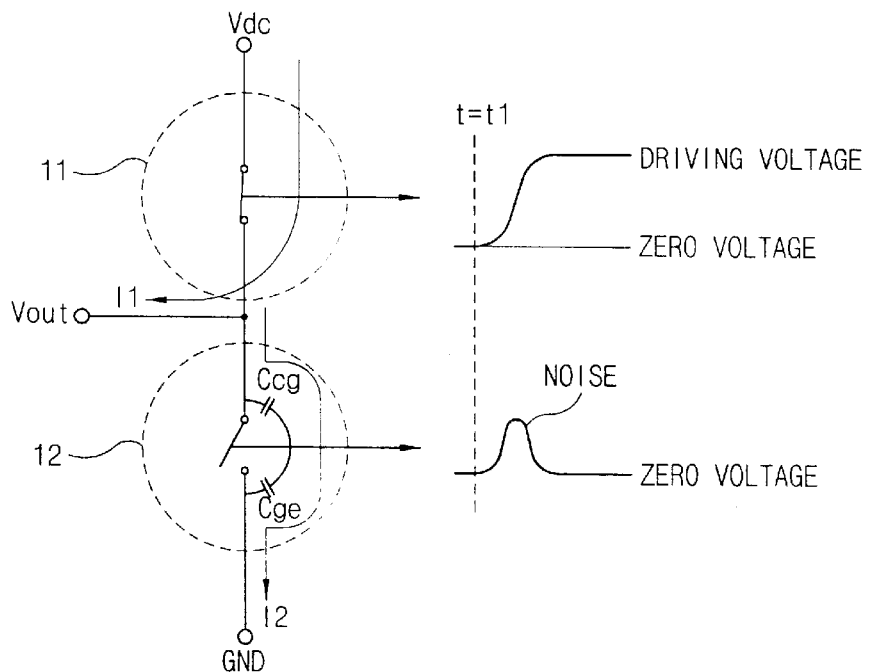
FIG. 4 illustrates an operation of the first IGBT 11 in FIG. 3.
Figure 5:
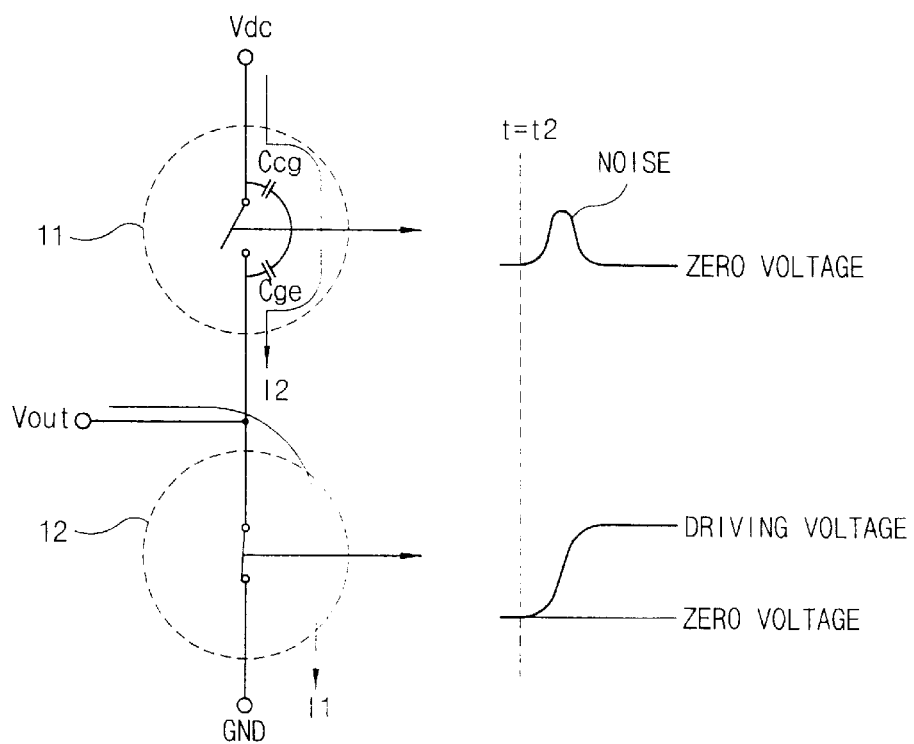
FIG. 5 illustrates an operation of the second IGBT 12 in FIG. 3.
Figure 6:
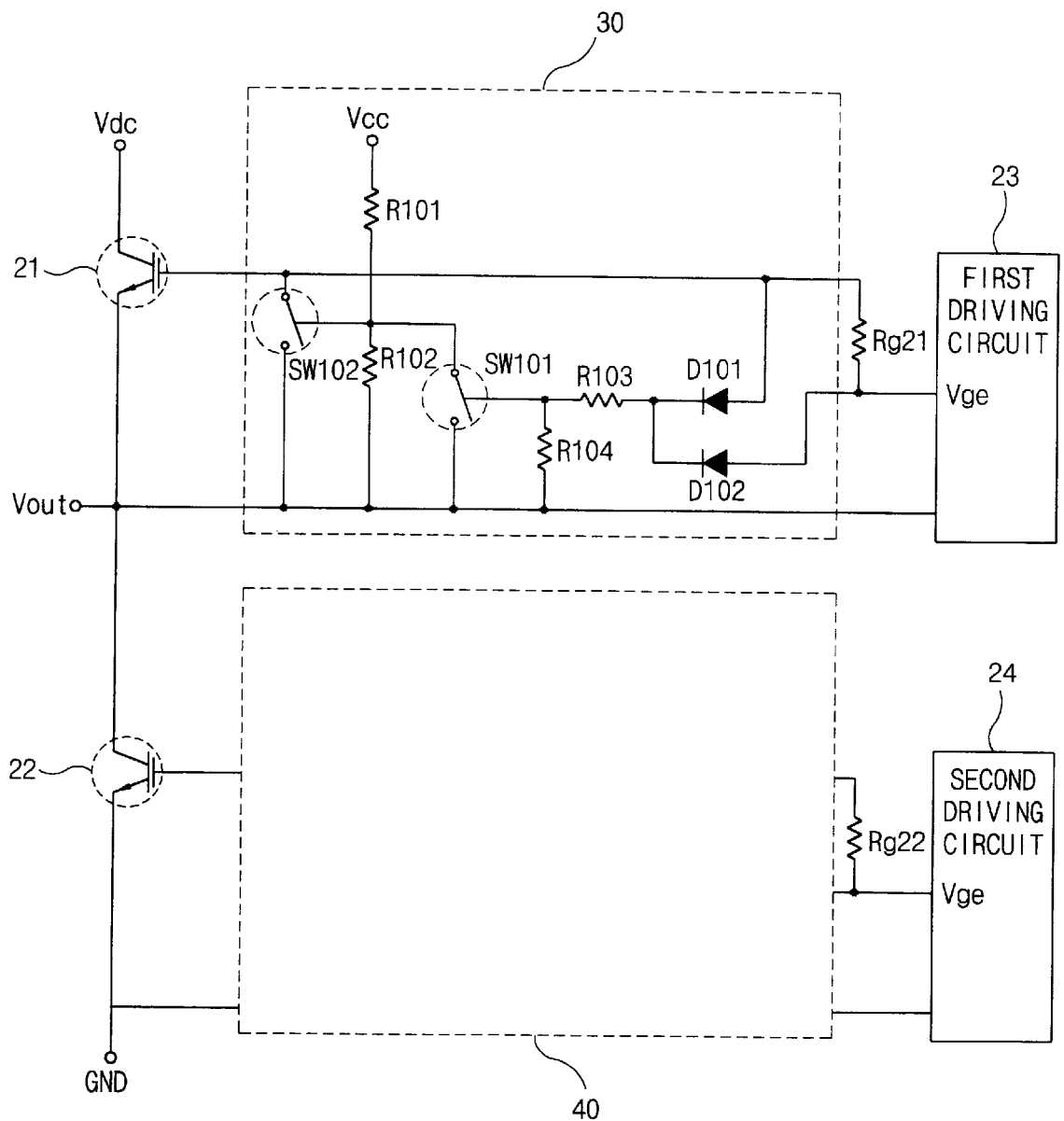
FIG. 6 illustrates a circuit for driving a gate in an IGBT inverter according to the present invention.

FIG. 6 illustrates a circuit for driving a gate in an IGBT inverter according to the present invention.

Referring to FIG. 6, a circuit for driving a gate in an IGBT inverter according to the present invention includes a first IGBT 21 of which collector is connected to a DC voltage source Vdc, a second IGBT 22 of which collector is connected to an emitter of the first IGBT 21 wherein an output signal is outputted from a connection point between the collector of the second IGBT 22 and the emitter of the first IGBT 21 and of which emitter is connected to a ground GND, first and second driving circuits 23 and 24 supplying gates and the emitters of the first and second IGBTs 21 and 22 with DC driving voltages Vge and Vge through first and second gate resistors Rg21 and Rg22, respectively, and first and second noise interruption circuits 30 and 40 connected between the gates emitters of the first and second IGBTs 21 and 22 and the first and second driving circuits 23 and 24, respectively, so as to interrupt noises.

The first noise interruption circuit 30 includes first and second resistors R101 and R102 connected in series between a DC power supply voltage Vcc and the emitter of the first IGBT 21, a first diode D101, a third resistor R103, and a fourth resistor R104 connected in series between the gate and emitter of the first IGBT 21, a second diode D102 applying a DC driving voltage of the first driving circuit 23 to a connection point between the first diode D101 and the third resistor R103, a first switch SW101 connected between a connection point between the first and second resistors R101 and R102 and the emitter of the first IGBT 21 so as to be switching controlled by the DC driving voltage distributed through the third and fourth resistors R103 and R104, and a second switch SW102 connected between the gate and emitter of the first IGBT 21 so as to be switched and controlled by a voltage at the connection point between the first and second resistors R101 and R102.

The second noise interruption circuit 40 connected between the second IGBT 22 and the second driving circuit 24 has the same construction of the first noise interruption circuit. Therefore, the construction of the inner circuit of the second noise interruption circuit 40 is skipped in the drawing.

Operation and effect of the above-constructed circuit for driving a gate in an IGBT inverter according to the present invention are explained in detail by referring to the attached drawing as follows.

First, applied between the gate and emitter of the first IGBT 21 by the first driving circuit 23, the DC driving voltage Vge is applied to the third and fourth resistors R103 and R104 through the second diode D102 so as to be distributed. Therefore, a distribution voltage V1 according to Formula 1 is applied to the first switch SW101 as a switching control signal.

$$V1=\{R104/(R103+R104)\}\times Vge \qquad \text{[Formula 1]}$$

In this case, the distribution voltage V1 should be enough to turn 'ON' the first switch SW101, and a current flowing through the 'ON' state of the first switch SW101 is adjusted by the first and second resistors R101 and R102 connected in series between the power supply voltage Vcc and the first IGBT 21 so as not to be too large amount.

In this case, levels of the DC driving voltage Vge and the distribution voltage V1 to turn on the first switch SW101 may vary in accordance with characteristics of circuit devices constructing the noise interruption circuit 30.

As the first switch SW 101 is turned on, a zero voltage as a switching control signal is applied to the second switch SW102 so as to turn off the second switch SW102. Thus, the DC driving voltage Vge is applied between the gate and emitter of the first IGBT 21. The moment the DC driving voltage Vge applied between the gate and emitter of the first IGBT 21 by the first driving circuit 23 is changed into a zero voltage, i.e. the moment the zero voltage is applied thereto as the DC driving voltage of the first driving circuit 23, a voltage across the gate and emitter of the first IGBT 21 is reduced by a first gate resistor Rg21 with a little temporal slope.

In this case, the voltage across the gate and emitter of the first IGBT 21 is applied to the third and fourth resistors R103 and R104 through the first diode D101 so as to be distributed in a manner of Formula 1. Thus, the distribution voltage V1 from Formula 1 is inputted as a switching control signal to the first switch SW101. When the distribution voltage V1 is decreased under a threshold voltage, the first switch SW101 is turned off.

Therefore, the second switch SW102 is turned off and controlled by a distribution voltage V2, as attained by formula 2, distributed by the first and second resistors R101 and R102 connected in series between the power supply voltage Vcc and the emitter of the first IGBT 21.

$$V2=[R102/(R101+R102)]\times Vcc \qquad \text{[Formula 2]}$$

In this case, values of the first and second resistors should be adjusted so that the distributed voltage V2 enables the second switch SW102 to be turned on.

As the second switch SW102 is turned on, the gate and emitter of the first IGBT 21 are conducted electrically each other. Thus, a zero voltage is applied between the gate and emitter of the first IGBT 21, and a noise is discharged by the equivalent capacitance Cge between the gate and emitter. Hence, a generation of the noise is prevented.

The moment the driving voltage Vge applied between the gate and emitter of the first IGBT 21 by the first driving circuit 23 is changed from a zero voltage to the driving voltage, the driving voltage is applied to the third and fourth resistors R103 and R104 through the second diode D102 so as to be distributed by Formula 1. Thus, the distribution voltage V1 enables to turn on the first switch SW101. In this case, as the first gate resistor Rg21 delays the driving voltage, it is unable to apply the driving voltage thereto earlier through the first diode D101.

As the first switch SW101 turned on, a zero voltage is applied as a switching control signal of the second switch SW102 so as to turn off the second switch SW102. The DC driving voltage Vge having been delayed by the first gate resistor Rg21 is then normally applied between the gate and emitter of the first IGBT 21.

Constitution and operation of the second noise interruption circuit 40 are the same of the first noise interruption circuit 30. Thus, the first and second noise interruption circuits 30 and 40 prevent the generation of the noises due to the equivalent capacitances between the gates and emitters. Consequently, the first and second IGBTs are safe from destruction.

As mentioned in the above description, the circuit for driving a gate in an IGBT inverter according to the present invention interrupts the noises generated from the transition of the DC driving voltages using the noise interruption circuits connected between the IGBTs and the driving circuits, respectively. Accordingly, the present invention enables to settle the problems of the related art such as selection of the driving circuits, selection of the fate driving resistors, and limitation of a gate driving distance. Moreover, the present invention enables to improve a reliability of the circuits.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A circuit for driving a gate of an IGBT inverter, comprising:
    a first IGBT of which collector is connected to a DC voltage source;
    a second IGBT of which collector is connected to an emitter of the first IGBT and of which emitter is connected to a ground;
    first and second driving circuits supplying gates and the emitters of the first and second IGBTs with DC driving voltages, respectively, through first and second gate resistors; and
    first and second noise interruption circuits connected between the gates-emitters of the first and second IGBTs and the first and second driving circuits, respectively, so as to interrupt noises, each of the first and second noise interruption circuits comprising:
    first and second diodes for supplying the DC driving voltage of the first driving circuit;
    first resistors for distributing the DC driving voltage;
    a first switch ON/OFF controlled by the distributed DC driving voltage;
    second resistors connected in series between the DC voltage source and the emitter of the first IGBT for distributing a DC voltage from the DC voltage source in accordance with an ON/OFF state of the first switch; and
    a second switch ON/OFF controlled by the distributed DC voltage.

* * * * *